(12) United States Patent
Zou

(10) Patent No.: US 11,892,486 B2
(45) Date of Patent: Feb. 6, 2024

(54) FREQUENCY DEBUGGING BOARD, FREQUENCY DEBUGGING SYSTEM, AND METHOD FOR DEBUGGING ELECTRONIC DEVICE

(71) Applicant: BOE TECHNOLOGY GROUP CO., LTD., Beijing (CN)

(72) Inventor: Xiangxiang Zou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 182 days.

(21) Appl. No.: 17/641,351

(22) PCT Filed: Mar. 16, 2021

(86) PCT No.: PCT/CN2021/081085
§ 371 (c)(1),
(2) Date: Mar. 8, 2022

(87) PCT Pub. No.: WO2021/185248
PCT Pub. Date: Sep. 23, 2021

(65) Prior Publication Data
US 2022/0357378 A1    Nov. 10, 2022

(30) Foreign Application Priority Data

Mar. 16, 2020 (CN) .......................... 202010183045.2

(51) Int. Cl.
*G01R 23/02* (2006.01)
*G01R 27/26* (2006.01)
(Continued)

(52) U.S. Cl.
CPC ......... *G01R 23/02* (2013.01); *G01R 27/2605* (2013.01); *G01R 29/0871* (2013.01);
(Continued)

(58) Field of Classification Search
CPC ................ G01R 23/02; G01R 27/2605; G01R 29/0871; G01R 31/2822; H01Q 7/00;
(Continued)

(56) References Cited

U.S. PATENT DOCUMENTS 9,373,882 B2 * 6/2016 McFarthing ............... H03J 7/12
2002/0183013 A1 12/2002 Auckland et al.
2005/0219132 A1 10/2005 Charrat
2017/0084989 A1 3/2017 Shi et al.
2022/0198236 A1 * 6/2022 Pichler ............... G06K 19/0724

FOREIGN PATENT DOCUMENTS

CN       1711682 A    12/2005
CN     101290607 A    10/2008
(Continued)

OTHER PUBLICATIONS

Cheng Ming et al., Simulation and Debugging Methods for a Radio Frequency Identification (RFID) Energy Storage Antenna, Foundation Supported Project, 2006.
(Continued)

*Primary Examiner* — Amy He
(74) *Attorney, Agent, or Firm* — IP & T GROUP LLP

(57) ABSTRACT

A frequency debugging board includes a bottom plate; a variable capacitor and a plurality of first probes that are all disposed on the bottom plate, two ends of the variable capacitor being each connected to a first probe; and a plurality of second probes and at least one switch that are all disposed on the bottom plate, any two adjacent second probes being connected to each other through a switch.

20 Claims, 4 Drawing Sheets

(51) Int. Cl.
  *G01R 29/08* (2006.01)
  *H01Q 7/00* (2006.01)
  *H01Q 5/314* (2015.01)
  *H01Q 1/22* (2006.01)
(52) U.S. Cl.
  CPC ........... *H01Q 1/2225* (2013.01); *H01Q 5/314* (2015.01); *H01Q 7/00* (2013.01)
(58) Field of Classification Search
  CPC ........ H01Q 1/2225; H01Q 1/38; H01Q 5/314; H01Q 1/526; H04B 5/0043
  See application file for complete search history.

(56) References Cited

FOREIGN PATENT DOCUMENTS

| | | |
|---|---|---|
| CN | 101303379 A | 11/2008 |
| CN | 101483419 A | 7/2009 |
| CN | 202025039 U | 11/2011 |
| CN | 102636741 A | 8/2012 |
| CN | 202383276 U | 8/2012 |
| CN | 202564547 U | 11/2012 |
| CN | 105391503 A | 3/2016 |
| CN | 107925160 A | 4/2018 |
| CN | 111244632 A | 6/2020 |
| EP | 1068652 A1 | 10/1999 |
| JP | 2000-284010 A | 10/2000 |

OTHER PUBLICATIONS

The First Office Action for Chinese Patent Application No. 202010183045.2 issued by the Chinese Patent Office dated Nov. 5, 2020.

The Second Office Action for Chinese Patent Application No. 202010183045.2 issued by the Chinese Patent Office dated Jun. 4, 2021.

Notification to Grant Patent Right for Invention for Chinese Patent Application No. 202010183045.2 issued by the Chinese Patent Office dated Dec. 3, 2021.

\* cited by examiner

FREQUENCY DEBUGGING BOARD, FREQUENCY DEBUGGING SYSTEM, AND METHOD FOR DEBUGGING ELECTRONIC DEVICE

CROSS-REFERENCE TO RELATED APPLICATIONS

This application is a national phase entry under 35 USC 371 of International Patent Application No. PCT/CN 2021/081085 filed on Mar. 16, 2021, which claims priority to Chinese Patent Application No. 202010183045.2, filed on Mar. 16, 2020, which are incorporated herein by reference in their entirety.

TECHNICAL FIELD

The present disclosure relates to the field of electronic device debugging technologies, and in particular, to a frequency debugging board, a frequency debugging system, and a method for debugging an electronic device.

BACKGROUND

With the increasing diversification of electronic devices, electronic price tags based on near field communication (NFC) are increasingly popular due to characteristics of simple system structure, low cost, low power consumption, high security, and ease of use.

SUMMARY

In an aspect, a frequency debugging board is provided. The frequency debugging board includes a bottom plate; a variable capacitor and a plurality of first probes that are all disposed on the bottom plate, two ends of the variable capacitor being each connected to a first probe; and a plurality of second probes and at least one switch that are all disposed on the bottom plate, any two adjacent second probes being connected to each other through a switch.

In some embodiments, the frequency debugging board further includes a controller disposed on the bottom plate. The controller is connected to the variable capacitor and the at least one switch, and is configured to change a capacitance of the variable capacitor and a state of the at least one switch.

In some embodiments, the frequency debugging board further includes a communication interface disposed on the bottom plate. The communication interface is connected to the controller.

In some embodiments, the frequency debugging board further includes a shielding layer disposed on the bottom plate. The variable capacitor, the at least one switch, the controller and the communication interface are located on a first surface of the bottom plate. The shielding layer is located on a second surface of the bottom plate. The plurality of first probes and the plurality of second probes penetrate through the bottom plate and the shielding layer. An end of a first probe and an end of a second probe are in contact with the first surface, and another end of the first probe and another end of the second probe protrude from the shielding layer. The first surface and the second surface are opposite to each other, and are perpendicular to a thickness direction of the bottom plate.

In another aspect, a frequency debugging system is provided. The frequency debugging system includes: an electronic device including an antenna to be tested and a capacitor to be tested; a test coil configured to receive a signal sent by the antenna to be tested; a frequency tester connected to the test coil and configured to detect a frequency of the signal in the test coil from the antenna to be tested, the frequency of the signal being an operating frequency of the electronic device; a terminal connected to the frequency tester, the terminal being configured to receive the operating frequency of the electronic device sent by the frequency tester, and to determine whether a deviation of the operating frequency of the electronic device from a target frequency is within an allowable range; and the frequency debugging board in the above embodiments. The frequency debugging board is connected to the terminal, and is arranged opposite to a side, where the antenna to be tested and the capacitor to be tested are located, of the electronic device. The frequency debugging board is configured to: receive an instruction sent by the terminal, and change at least one of a capacitance of the variable capacitor and a state of the at least one switch according to the instruction, so as to adjust the operating frequency of the electronic device to keep the deviation of the operating frequency of the electronic device from the target frequency within the allowable range.

In some embodiments, the plurality of first probes are connected to the capacitor to be tested, and the plurality of second probes are connected to different portions of the antenna to be tested.

In some embodiments, the electronic device includes a plurality of first contacts. Two ends of the capacitor to be tested are each connected to a first contact. The plurality of first probes are connected to the plurality of first contacts in one-to-one correspondence. The electronic device includes a plurality of second contacts. Each turn of a coil of the antenna to be tested is connected to a second contact. The plurality of second probes are connected to the plurality of second contacts in one-to-one correspondence.

In some embodiments, a number of the plurality of second probes is same as a number of turns of a coil of the antenna to be tested, and a second probe is correspondingly connected to a turn of the coil of the antenna to be tested.

In some embodiments, in a case where the frequency debugging board includes the communication interface, the frequency debugging board is connected to the terminal through the communication interface, so as to receive the instruction from the terminal.

In some embodiments, in a case where the frequency debugging board includes the shielding layer, the shielding layer is located on a side of the frequency debugging board proximate to the electronic device.

In some embodiments, the antenna to be tested is one of an antenna based on a near field communication technology and an antenna based on a radio frequency identification technology.

In some embodiments, the electronic device further includes a display panel, and the display panel is one of an electronic paper display panel, a liquid crystal display panel, an organic electroluminescent display panel or a quantum dot light-emitting diode display panel.

In some embodiments, the electronic device is one of an electronic price tag, a mobile phone, a tablet computer or a wearable device.

In yet another aspect, a method for debugging the electronic device in the frequency debugging system in the above embodiments is provided. The method includes: receiving, by the test coil, the signal sent by the antenna to be tested in the electronic device; transmitting, by the test coil, the received signal to the frequency tester; detecting, by the frequency tester, the frequency of the signal sent by the test coil; transmitting, by the frequency tester, the detected operating frequency of the electronic device to the terminal, the frequency of the signal being the operating frequency of the electronic device; determining, by the terminal, whether the deviation of the operating frequency of the electronic device from the target frequency is within the allowable range; and if the deviation of the operating frequency of the electronic device from the target frequency is not within the allowable range, sending, by the terminal, the instruction to the controller in the frequency debugging board, so that the controller changes at least one of the capacitance of the variable capacitor and the state of the at least one switch in the frequency debugging board, so as to adjust the operating frequency of the electronic device to keep the deviation of the operating frequency of the electronic device from the target frequency within the allowable range.

In some embodiments, the controller changing at least one of the capacitance of the variable capacitor and the state of the at least one switch in the frequency debugging board, so as to adjust the operating frequency of the electronic device to keep the deviation of the operating frequency of the electronic device from the target frequency within the allowable range, includes: obtaining, by the terminal, an inductance of the antenna to be tested according to the operating frequency of the electronic device detected by the frequency tester, an initial capacitance of the capacitor to be tested, and an initial capacitance of the variable capacitor; if the inductance is greater than or equal to an inductance threshold value, changing, by the controller, the state of each switch in the frequency debugging board, until the inductance is less than the inductance threshold value; then, adjusting, by the controller, the capacitance of the variable capacitor to change the operating frequency of the electronic device accordingly, until the deviation of the operating frequency of the electronic device from the target frequency is within the allowable range; and if the inductance is less than the inductance threshold value, changing, by the controller, the capacitance of the variable capacitor in the frequency debugging board to change the operating frequency of the electronic device accordingly, until the deviation of the operating frequency of the electronic device from the target frequency is within the allowable range.

In some embodiments, the initial capacitance of the variable capacitor is 0.

In some embodiments, the method further includes: when the inductance of the antenna to be tested is less than the inductance threshold value, recording, by the terminal, a state of each switch at this time. When the deviation of the operating frequency of the electronic device from the target frequency is within the allowable range, recording, by the terminal, a capacitance of the variable capacitor at this time as a target capacitance.

In some embodiments, the method further includes at least one of: soldering a capacitor with the target capacitance to the electronic device; or, connecting second contacts of the antenna to be tested corresponding to each switch that is closed in the at least one switch.

In yet another aspect, a non-transitory computer-readable storage medium is provided. The non-transitory computer-readable storage medium has stored therein computer program instructions that, when executed by a processor, cause the processor to perform the method for debugging the display device in the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method, and an actual timing of a signal involved in the embodiments of the present disclosure.

DETAILED DESCRIPTION

Figure 1:
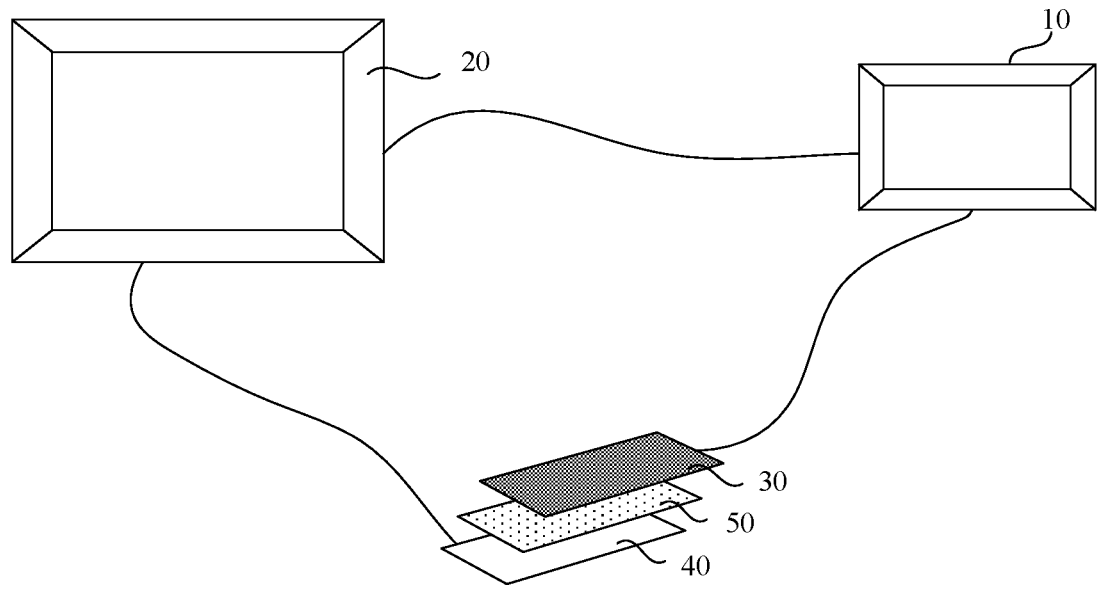
FIG. 1 is a structural diagram of a frequency debugging system, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms such as "first" and "second" are only used for descriptive purposes, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled" and "connected" and their derivatives may be used. For example, the term "connected" may be used in the description of some embodiments to indicate that two or more components are in direct physical or electrical contact with each other. For another example, the term "coupled"

may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

Electronic price tags are electronic devices with an information transceiving function, and are mainly used in supermarkets, convenience stores and pharmacies, which are able to perform data interaction with handheld terminals. The operating principle is as follows. The handheld terminal sends a radio signal carrying commodity data information to the electronic price tag, and the electronic price tag receives the radio signal and displays the commodity data information carried by the radio signal on a display screen.

The electronic price tag may be an electronic price tag based on radio frequency identification (RFID), or an electronic price tag based on NFC.

An operating frequency of the electronic device such as the electronic price tag is required to be within a certain range. If the operating frequency exceeds this range, a communication quality and a communication distance of the electronic device are greatly reduced. For example, the operating frequency of the electronic price tag based on NFC is required to be within a range of (13.56±0.002) MHz. Therefore, in order to keep a deviation of the operating frequency of the electronic device such as the electronic price tag from a target frequency (for example, a target frequency of the electronic price tag based on NFC is 13.56 MHz) within an allowable range, so as to ensure the communication quality and the communication distance of the electronic device, it is necessary to debug the operating frequency of the electronic device. For example, the allowable range is ±0.002 MHz. That is, an absolute value of a difference between the operating frequency of the electronic device and the target frequency is 0.002 MHz.

On this basis, some embodiments of the present disclosure provide a frequency debugging system. As shown in FIG. 1, the frequency debugging system includes a terminal 10, a frequency tester 20 and a frequency debugging board 30 that are connected to the terminal 10, a test coil 40 connected to the frequency tester 20, and an electronic device 50 connected to the frequency debugging board 30.

In some embodiments, the electronic device 50 is located between the frequency debugging board 30 and the test coil 40. The electronic device 50 may be an electronic price tag, a wearable device, a mobile phone, or a tablet computer.

The test coil 40 is configured to receive a signal sent by the electronic device 50, and transmit the received signal to the frequency tester 20.

The frequency tester 20 is configured to detect a frequency of the signal transmitted by the test coil 40 to obtain an operating frequency of the electronic device 50, and output the operating frequency of the electronic device 50 to the terminal 10. In some embodiments, the frequency tester 20 may be a vector network analyzer.

The terminal 10 is configured to receive the operating frequency of the electronic device 50 sent by the frequency tester 20, and If a deviation of the operating frequency of the electronic device 50 from a target frequency is outside an allowable range, send an instruction to the frequency debugging board 30. Thus, by debugging the operating frequency of the electronic device 50 through the frequency debugging board 30, the deviation of the operating frequency of the electronic device 50 from the target frequency is within the allowable range. In some embodiments, the terminal 10 may be a notebook computer, a desktop computer, a tablet computer, or a mobile phone.

The frequency debugging board 30 is configured to debug the operating frequency of the electronic device 50, so as to keep the deviation of the operating frequency of the electronic device 50 from the target frequency within the allowable range.

In the frequency debugging system in some embodiments of the present disclosure, the frequency debugging board 30 debugs the operating frequency of the electronic device 50, so that the deviation of the operating frequency of the electronic device 50 from the target frequency is within the allowable range, thereby ensuring a communication distance and a communication quality of the electronic device 50.

Figure 2:
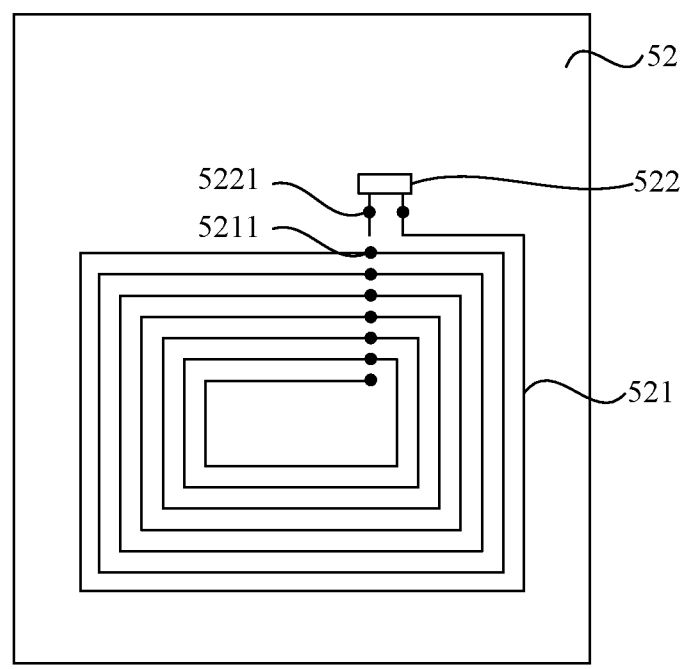
FIG. 2 is a structural diagram of a circuit board in an electronic device, in accordance with some embodiments.
Figure 5:
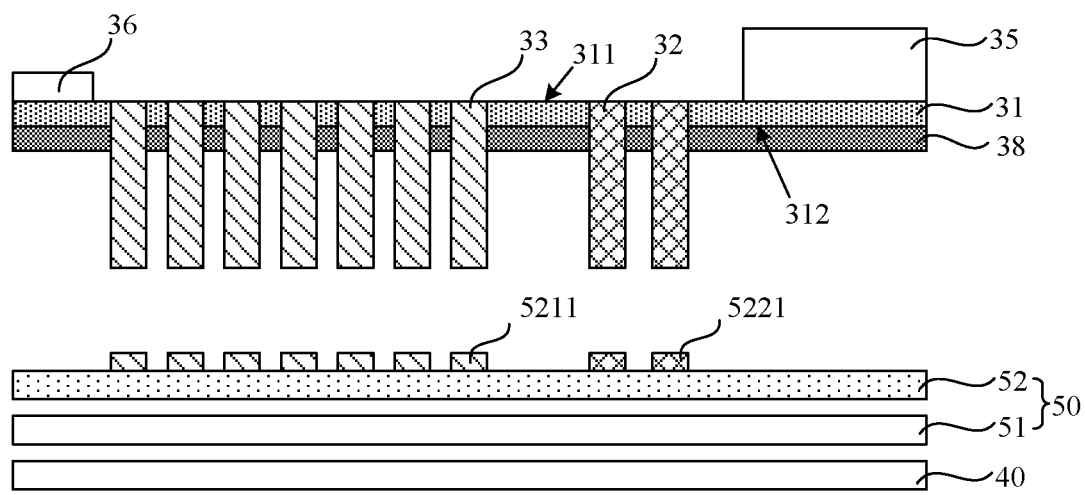
FIG. 5 is a partial structural diagram of a frequency debugging system in debugging an electronic device, in accordance with some embodiments.

In some embodiments, as shown in FIGS. 2 and 5, the electronic device 50 includes a display panel 51 and a circuit board 52. The circuit board 52 is arranged behind the display panel 51 as viewed directly facing a display surface of the electronic device 50. For example, the display panel 51 may be an electronic paper display panel (EPD display panel), a liquid crystal display panel (LCD display panel), an organic electroluminescent display panel (OLED display panel), or a quantum dot light-emitting diode display panel (QLED display panel). The circuit board 52 includes an antenna 521 and a capacitor 522 connected to the antenna 521. When the operating frequency of the electronic device 50 is debugged, the antenna 521 is referred to as the antenna to be tested 521, and the capacitor 522 is referred to as the capacitor to be tested 522. When the operating frequency of the electronic device 50 is debugged, the signal sent by the electronic device 50 and received by the test coil 40 is a signal sent by the antenna to be tested 521. The antenna to be tested 521 and the capacitor to be tested 522 form an LC resonant circuit. A resonant frequency of the LC resonant circuit, i.e., the operating frequency of the electronic device 50, is calculated by using the following formula.

$$f = \frac{1}{2\pi\sqrt{LC}} \qquad \text{Formula (1)}$$

It can be seen from the above formula that the operating frequency of the electronic device 50 may be adjusted by adjusting an inductance L of the antenna to be tested 521 or a capacitance C of the capacitor to be tested 522.

In some embodiments, in order to connect the frequency debugging board 30 to the antenna to be tested 521 and the capacitor to be tested 522 in the electronic device 50, so that the frequency debugging board 30 may adjust the operating frequency of the electronic device 50 by changing the inductance L of the antenna to be tested 521 and/or the capacitance C of the capacitor to be tested 522, as shown in FIG. 2, the circuit board 52 further includes a plurality of first contacts 5221 disposed at two ends of the capacitor to be tested 522, and a plurality of second contacts 5211 disposed on the antenna to be tested 521. The frequency debugging board 30 is connected to the capacitor to be tested 522 through the plurality of first contacts 5221, and is connected to different portions of the antenna to be tested 521 through the plurality of second contacts 5211.

The number of the plurality of first contacts 5221 and the number of the plurality of second contacts 5211 are not limited, and each of which may be two, three, or more than three. Two first contacts 5221 and seven second contacts 5211 are shown in FIG. 2.

The arrangement of the plurality of second contacts 5211 is not limited. A part of a coil of the antenna to be tested 521 are provided with a plurality of second contacts. Or, each turn of the coil of the antenna to be tested 521 is provided with the second contact. FIG. 2 shows that each turn of the coil of the antenna to be tested 521 is provided with the second contact. In this case, the number of the plurality of second contacts 5211 is equal to a total number of turns of the coil of the antenna to be tested 521.

Figure 3:
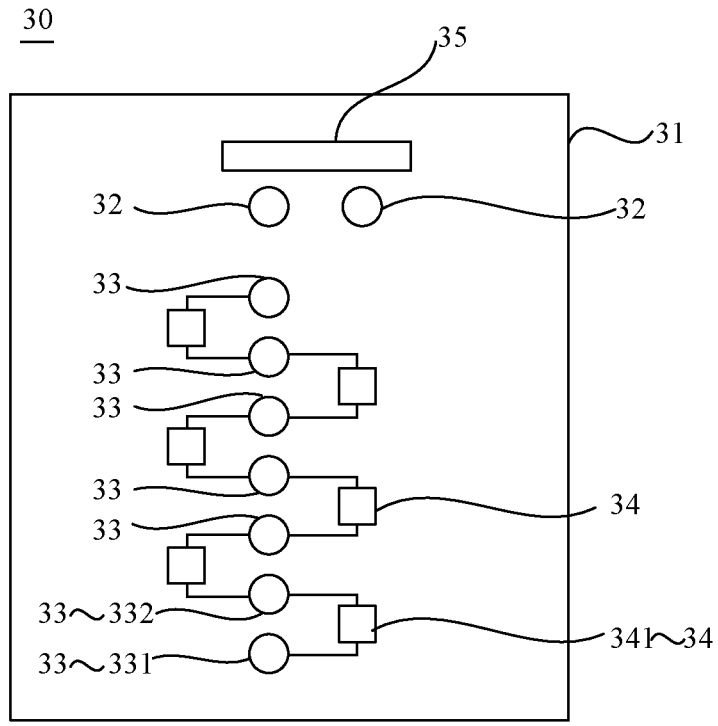
FIG. 3 is a structural diagram of a frequency debugging board, in accordance with some embodiments.

In some embodiments, as shown in FIG. 3, the frequency debugging board 30 includes a bottom plate 31, and a plurality of first probes 32, a plurality of second probes 33, at least one switch 34 and a variable capacitor 35 that are all provided on the bottom plate 31. Two ends of the variable capacitor 35 are each connected to a first probe 32, and any two adjacent second probes 33 are connected to each other through the switch 34.

The number of the plurality of first probes 32, the number of the plurality of second probes 33 and the number of the at least one switch 34 are not limited. The number of the plurality of first probes 32 may be two, three, or more than three. The number of the plurality of second probes 33 may be two, three, or more than three. The number of the at least one switch 34 may be one, two, or more than two. For example, two first probes 32, seven second probes 33 and six switches 34 are shown in FIG. 2.

When the operating frequency of the electronic device 50 is debugged, the plurality of first probes 32 in the frequency debugging board 30 are connected to the plurality of first contacts 5221 at the two ends of the capacitor to be tested 522 in one-to-one correspondence, so that the variable capacitor 35 and the capacitor to be tested 522 are connected in parallel. In this case, the capacitance C of the capacitor to be tested 522 is a sum of an initial capacitance C1 of the capacitor to be tested 522 and a capacitance C2 of the variable capacitor 35, i.e., C=C1+C2. Since the initial capacitance C1 of the capacitor to be tested 522 is a fixed value, the capacitance C of the capacitor to be tested 522 is changed by changing the capacitance C2 of the variable capacitor 35, so as to adjust the operating frequency of the electronic device 50.

In some embodiments, the initial capacitance C1 of the capacitor to be tested 522 is 0. In this case, the capacitance C of the capacitor to be tested 522 is the capacitance C2 of the variable capacitor 35, i.e., C=C2.

The plurality of second probes 33 in the frequency debugging board 30 are connected to the plurality of second contacts on the antenna to be tested 521 in one-to-one correspondence. By controlling a state of each switch 34, i.e., opening or closing the switch 34, the number of turns of the coil of the antenna to be tested 521 connected to the LC resonant circuit is changed, so as to change the inductance L of the antenna to be tested 521, thereby adjusting the operating frequency of the electronic device 50.

In an example where each turn of the coil of the antenna to be tested 521 is provided with the second contact 5211, in this case, the at least one switch 34 includes a plurality of switches 34. For the convenience of distinction, in the state shown in FIG. 3, the switches 34 are numbered 1 (i.e., 341 in FIG. 3), 2, 3, 4, 5 . . . n from bottom to top, and the second probes 33 are numbered 1 (i.e., 331 in FIG. 3), 2, 3, 4, 5 . . . m from bottom to top. An initial state of the switch 34 is an OPEN state, and in this case, any two second probes 33 are disconnected. When switch(s) 34 are in a CLOSE state, for example, a No. 1 switch 341 is closed, two adjacent second probes 33 (i.e., a No. 1 second probe 331 and a No. 2 second probe 332) connected through the No. 1 switch 341 are connected. Since the plurality of second probes 33 are connected to the plurality of second contacts 5211 on the antenna to be tested 521 in one-to-one correspondence, two adjacent turns of the coil of the antenna to be tested 521 corresponding to the No. 1 second probe 331 and the No. 2 second probe 332 are connected to the LC resonant circuit, so that the number of turns of the coil of the antenna to be tested 521 connected to the LC resonant circuit is reduced, thereby reducing the inductance of the antenna to be tested 521. Generally, the magnitude of the inductance is proportional to the number of turns of the coil, and the smaller the number of turns of the coil is, the smaller the inductance is.

When only one switch 34 is closed, there are $C_n^1$ situations. When two switches 34 are closed, there are $C_n^2$ situations. When three switches 34 are closed, there are $C_n^3$ situations . . . . That is, the switches 34 have $C_n^1+C_n^2+C_n^3+\ldots C_n^n$ states in total, and each state corresponds to an inductance of the antenna to be tested 521.

In the frequency debugging board 30 in some embodiments of the present disclosure, the inductance of the antenna to be tested 521 and the capacitance of the capacitor to be tested 522 in the electronic device 50 are adjusted by adjusting the capacitance of the variable capacitor 35 and the state of each switch 34, so that the operating frequency of the electronic device 50 is adjusted, so as to keep the deviation of the operating frequency of the electronic device 50 from the target frequency within the allowable range. Therefore, a debugging efficiency of the operating frequency of the electronic device 50 is improved, which is convenient to modify the circuit board 52 in the electronic device 50. It can be understood that after the circuit board 52 is modified, the deviation of the operating frequency of the electronic device 50 from the target frequency is within the allowable range.

Figure 4:
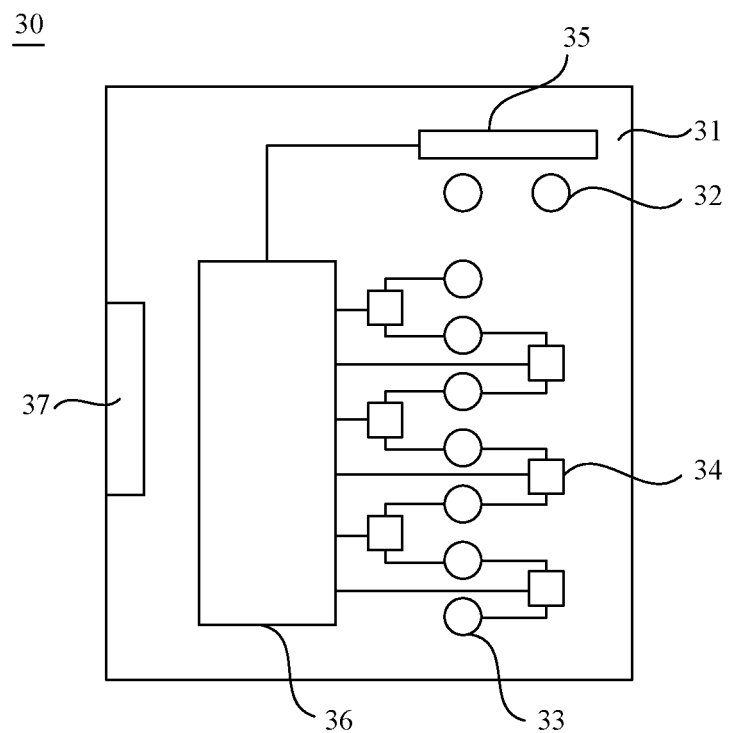
FIG. 4 is a structural diagram of another frequency debugging board, in accordance with some embodiments.

In some embodiments, as shown in FIG. 4, the frequency debugging board 30 further includes a controller 36. The controller 36 is connected to the variable capacitor 35 and each switch 34, and is configured to change the capacitance of the variable capacitor 35 and the state of each switch 34. The controller 36 may be a single-chip microcomputer, an application-specific integrated circuit (ASIC), or a field-programmable gate array (FPGA). The controller 36 controls the capacitance of the variable capacitor 35 and the state of each switch 34, the operating frequency of the electronic device 50 is debugged automatically, which avoids manual debugging, and further improves the debugging efficiency of the operating frequency of the electronic device 50.

In some embodiments, as shown in FIGS. 4 and 5, the frequency debugging board 30 further includes a communication interface 37 disposed on the bottom plate 31, and a shielding layer 38 disposed on a side of the bottom plate 31 proximate to the electronic device 50 in a thickness direction of the bottom plate 31. The communication interface 37 may be a wired or wireless interface, such as an Ethernet interface, a universal serial bus (USB) interface, or an interface by using wireless fidelity (Wi-Fi) or Bluetooth. The communication interface 37 is connected to the controller 36. The frequency debugging board 30 performs two-way communication with the terminal 10 through the communication interface 37, which is convenient for calling data and sending instructions. The shielding layer 38 is, for example, a metal shielding layer. The variable capacitor 35, the at least one switch 34, the controller 36, and the communication interface 37 are located on a first surface 311 of the bottom plate 31, and the shielding layer 38 is located on a second surface 312 of the bottom plate 31. The first surface and the second surface are opposite to each other, and are perpendicular to the thickness direction of the bottom plate 31. The shielding layer 38 may prevent electrical signals in the frequency debugging board 30 from interfering with the electronic device 50. In some embodiments, the plurality of first probes 32 and the plurality of second probes 33 penetrate through the bottom plate 31 and the shielding layer 38. An end of the first probe 32 and an end of the second probe 33 are in contact with the first surface 311, and another end of the first probe 32 and another end of the second probe 33 protrude from the shielding layer 38.

Some embodiments of the present disclosure further provide a method for debugging an electronic device by using the frequency debugging system. The method includes following steps. The test coil 40 receives a signal sent by the antenna to be tested 521 in the electronic device 50, and transmits the received signal to the frequency tester 20. The frequency tester 20 detects a frequency of the signal sent by the test coil 40 (the frequency of the signal is an operating frequency of the electronic device 50), and transmits the detected operating frequency of the electronic device 50 to the terminal 10. The terminal 10 determines whether a deviation of the operating frequency of the device 50 from a target frequency is within an allowable range, and the allowable range is, for example, ±0.002 MHz. If not, the terminal 10 sends an instruction to the controller 36 in the frequency debugging board 30, so that the controller 36 changes a capacitance of the variable capacitor 35 in the frequency debugging board 30 and/or state(s) of the at least one switch 34 in the frequency debugging board 30, thereby adjusting the operating frequency of the electronic device 50 to keep the deviation of the operating frequency of the electronic device 50 from the target frequency within the allowable range.

It is expected that when the deviation of the operating frequency of the electronic device 50 from the target frequency is debugged to be within the allowable range through the frequency debugging board 30, the circuit board 52 in the electronic device 50 may be modified according to the inductance of the antenna to be tested 521 and the capacitance of the capacitor to be tested 522 in the electronic device 50 at this time. It can be understood that after the circuit board 52 is modified, the deviation of the operating frequency of the electronic device 50 from the target frequency is within the allowable range.

In some embodiments, the controller 36 changing the capacitance of the variable capacitor 35 in the frequency debugging board 30 and/or the state(s) of the at least one switch 34 in the frequency debugging board 30, thereby adjusting the operating frequency of the electronic device 50 to keep the deviation of the operating frequency of the electronic device 50 from the target frequency within the allowable range, includes: the terminal 10 calculating the inductance of the antenna to be tested 521 according to the operating frequency of the electronic device 50 detected by the frequency tester 20, an initial capacitance of the capacitor to be tested 522 in the electronic device 50, and an initial capacitance of the variable capacitor 35 in the frequency debugging board 30, and determining whether the inductance is greater than or equal to an inductance threshold value that is preset. The initial capacitance of the variable capacitor 35 may be 0. The inductance threshold value is, for example, 5 microhenries (uH).

If the inductance is greater than or equal to the inductance threshold value, the controller 36 changes the state of each switch 34 in the frequency debugging board 30 to adjust the inductance of the antenna to be tested 521 until the inductance is less than the inductance threshold value, and the terminal 10 records the state of each switch 34 at this time. Then, the controller 36 adjusts the capacitance of the variable capacitor 35 to change the operating frequency of the electronic device 50 accordingly until the deviation of the operating frequency of the electronic device 50 from the target frequency is within the allowable range, and the terminal 10 records a capacitance of the variable capacitor 35 at this time as a target capacitance. A capacitor with the target capacitance is soldered to the circuit board 52 in the electronic device 50, and the number of turns of the coil of the antenna to be tested 521 is reduced by welding or other methods according to the previously recorded state of each switch 34. As a result, the modification of the circuit board 52 in the electronic device 50 is realized.

If the inductance is less than the inductance threshold value, the controller 36 changes the capacitance of the variable capacitor 35 in the frequency debugging board 30 to change the operating frequency of the electronic device 50 accordingly until the deviation of the operating frequency of the electronic device 50 from the target frequency is within the allowable range, and the terminal 10 records a capacitance of the variable capacitor 35 at this time as a target capacitance. A capacitor with the target capacitance is soldered to the circuit board 52 in the electronic device 50. As a result, the modification of the circuit board 52 in the electronic device 50 is realized. Since the inductance is less than the inductance threshold value, the number of turns of the coil of the antenna to be tested 521 may not be reduced.

In terms of the manufacturing process, it is more convenient to change the capacitance of the capacitor to be tested 522 of the circuit board 52 than to change the inductance of the antenna to be tested 521 of the circuit board 52. In addition, in terms of the manufacturing process, for the antenna to be tested 521 that has already been manufactured on the circuit board 52, it is easy to reduce the number of turns of the coil, but it is not easy to increase the number of turns of the coil. In view of a relationship between the number of turns of the coil and the inductance (i.e., the smaller the number of turns is, the smaller the inductance is), therefore, when the calculated inductance of the antenna to be tested 521 is less than the inductance threshold value, the inductance of the antenna to be tested 521 may not be adjusted, so that the antenna to be tested 521 is not modified. Thus, the manufacturing process is simplified, and the production efficiency is improved.

Figure 6:
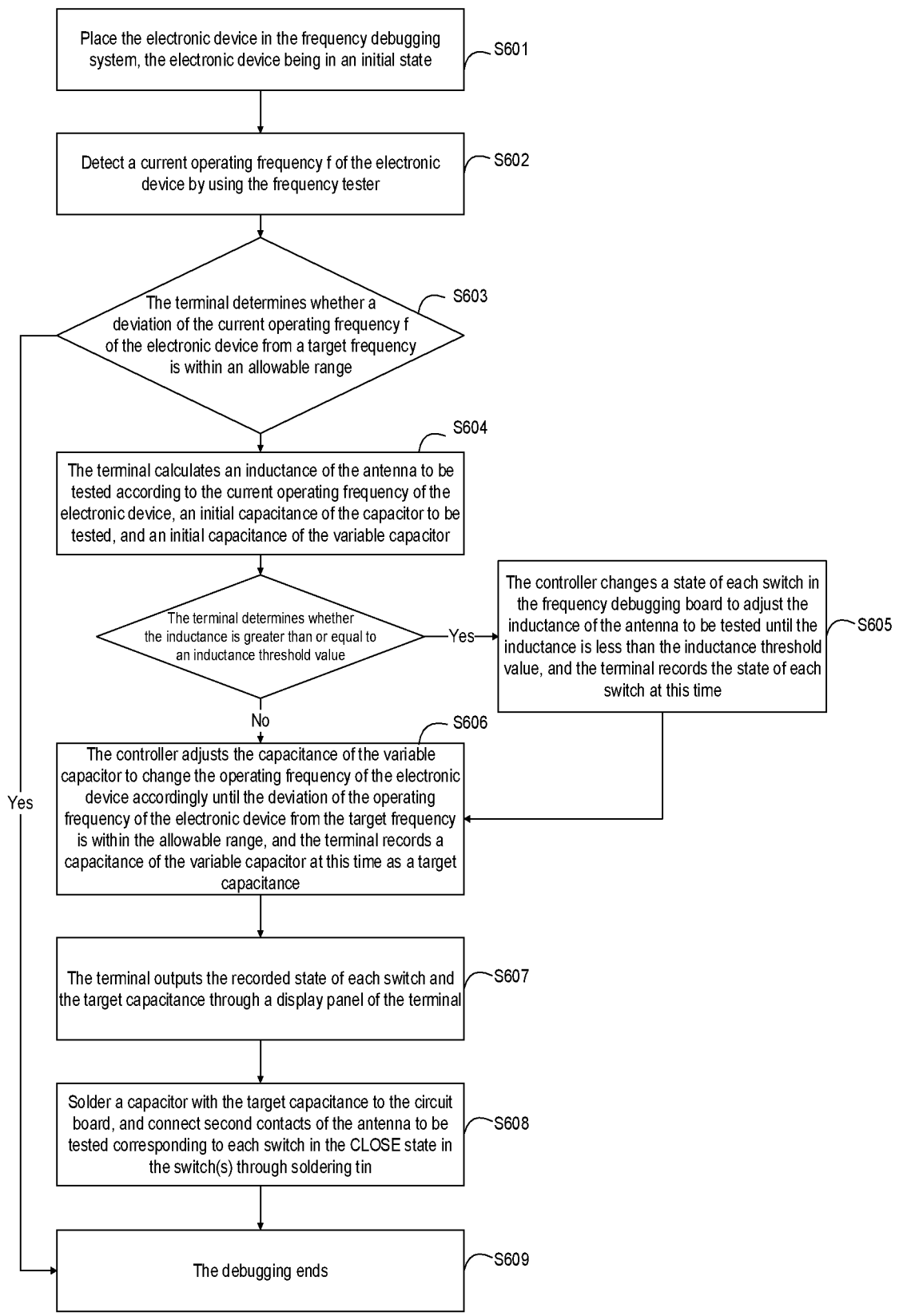
FIG. 6 is a flow diagram of a method for debugging an electronic device, in accordance with some embodiments.

FIG. 5 is a schematic partial structural diagram of a frequency debugging system in debugging an electronic device in some embodiments of the present disclosure. FIG. 6 is a flow diagram of a method for debugging an electronic device in some embodiments of the present disclosure. As shown in FIGS. 5 and 6, the method for debugging the electronic device includes following steps.

In S601, the electronic device 50 is placed in the frequency debugging system as shown in FIGS. 1 and 5, and the electronic device 50 is in an initial state.

The electronic device 50 may have the display panel 51 and the circuit board 52. The circuit board 52 includes the antenna to be tested 521 and the capacitor to be tested 522.

When the electronic device 50 is placed in the frequency debugging system, a side of the electronic device 50 is opposite to the test coil 40, and another opposite side of the electronic device 50 is opposite to the frequency debugging board 30. The test coil 40 is connected to the frequency tester 20. The frequency tester 20 and the frequency debugging board 30 are connected to the terminal 10.

The plurality of first probes 32 in the frequency debugging board 30 are connected to the plurality of first contacts 5221 at the two ends of the capacitor to be tested 522 in one-to-one correspondence, and the plurality of second probes 33 in the frequency debugging board 30 are connected to the plurality of second contacts 5211 on the antenna to be tested 521 in one-to-one correspondence.

The electronic device 50 is in the initial state, which may be that an initial capacitance of the variable capacitor 35 in the frequency debugging board 30 is 0, and the switch(s) 34 are all in the OPEN state. That is, the initial state of the electronic device 50 refers to a state before the electronic device 50 is debugged by the frequency debugging board 30.

In S602, as shown in FIG. 1, a current operating frequency f of the electronic device 50 is detected by using the frequency tester 20.

The antenna to be tested 521 in the electronic device 50 sends a signal to the test coil 40. The test coil 40 receives the signal, and transmits the received signal to the frequency tester 20. The frequency tester 20 detects a frequency of the signal sent by the test coil 40, so as to obtain the current operating frequency of the electronic device 50. The operating frequency of the electronic device 50 is the same as the frequency of the signal sent by the test coil 40.

In S603, the terminal 10 determines whether a deviation of the current operating frequency f of the electronic device 50 from a target frequency (such as 13.56 MHz) is within an allowable range (such as ±0.002 MHz). If yes, go to S609, and if not, go to S604.

In S604, the terminal 10 calculates an inductance of the antenna to be tested 521 according to the current operating frequency of the electronic device 50, an initial capacitance of the capacitor to be tested 522, and an initial capacitance of the variable capacitor 35 by using Formula (1), and determines whether the inductance is greater than or equal to an inductance threshold value. If the inductance is greater than or equal to the inductance threshold value, go to S605, and if the inductance is less than the inductance threshold value, go to S606.

The inductance threshold value is, for example, 5 uH, and the inductance threshold value may be adjusted according to different products or standards, which is not limited in some embodiments of the present disclosure.

The capacitor to be tested 522 and the antenna to be tested 521 in the electronic device 50 form an LC resonance circuit. The inductance may be increased by increasing the number of turns of the coil of the antenna to be tested 521, so that the antenna to be tested 521 has a longer operating distance. However, the capacitance of the capacitor to be tested 522 is required to be reduced accordingly. In a case where a resonant frequency of the LC resonant circuit is 13.56 MHz, if the inductance of the antenna to be tested 521 is too large (e.g., more than 5 uH), the value of the capacitance of the capacitor to be tested 522 is small, which makes it difficult to match the inductance and the capacitance. Therefore, the value of the inductance of the antenna to be tested 521 is controlled within a range of 0.3 uH to 5 uH, such as 0.3 uH, 0.5 uH, 1 uH, 1.5 uH, 2 uH, 2.5 uH, 3 uH, 3.5 uH, 4 uH, 4.5 uH, 5 uH. In this way, it is easy to match the inductance and the capacitance.

In S605, a state of each switch 34 in the frequency debugging board 30 is changed by the controller 36 to adjust the inductance of the antenna to be tested 521 until the inductance is less than the inductance threshold value, and the terminal 10 records the state of each switch 34 at this time.

In S606, the capacitance of the variable capacitor 35 is adjusted by the controller 36 to change the operating frequency of the electronic device 50 accordingly until the deviation of the operating frequency of the electronic device 50 from the target frequency is within the allowable range, and the terminal 10 records a capacitance of the variable capacitor 35 at this time as a target capacitance.

In S607, the terminal 10 outputs the recorded state of each switch 34 and the target capacitance through a display panel of the terminal 10.

In S608, a capacitor with the target capacitance is soldered to the circuit board 52, and second contacts 5211 of the antenna to be tested 521 corresponding to each switch in the CLOSE state in the switch(s) 34 are connected through soldering tin.

In S609, the debugging ends.

In some embodiments of the present disclosure, by adjusting the capacitance of the variable capacitor 35 in the frequency debugging board 30 and the state of each switch 34 in the frequency debugging board 30, the capacitance of the capacitor to be tested 522 and the inductance of the antenna to be tested 521 in the electronic device 50 may be adjusted, so as to adjust the operating frequency of the electronic device 50, and ensure that the deviation of the operating frequency of the electronic device 50 from the target frequency is within the allowable range.

Thus, the debugging efficiency of the operating frequency of the electronic device 50 is improved, and the circuit board 52 in the electronic device 50 is able to be modified conveniently.

Some embodiments of the present disclosure provide a computer-readable storage medium such as a non-transitory computer-readable storage medium) having stored therein computer program instructions that, when executed by a processor, cause the processor to perform one or more steps of the method for debugging the electronic device in the above embodiments.

For example, the computer-readable storage medium includes, but is not limited to, a magnetic storage device (e.g., a hard disk, a floppy disk or a magnetic tape), an optical disk (e.g., a compact disk (CD), a digital versatile disk (DVD)), a smart card, a flash memory device (e.g., an erasable programmable read-only memory (EPROM), a card, a stick or a key driver). Various computer-readable storage media described in the embodiments of the present disclosure may represent one or more devices for storing information and/or other machine-readable storage media. The term "machine-readable storage media" may include, but is not limited to, various other media capable of storing, containing and/or carrying instructions and/or data.

Beneficial effects of the computer-readable storage medium are the same as beneficial effects of the method for debugging the electronic device in some of the above embodiments, and will not be repeated here.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A frequency debugging board, comprising:
a bottom plate;
a variable capacitor and a plurality of first probes that are all disposed on the bottom plate, two ends of the variable capacitor being each connected to a first probe; and
a plurality of second probes and at least one switch that are all disposed on the bottom plate, any two adjacent second probes being connected to each other through a switch.

2. The frequency debugging board according to claim 1, further comprising a controller disposed on the bottom plate, wherein the controller is connected to the variable capacitor and the at least one switch, and is configured to change a capacitance of the variable capacitor and a state of the at least one switch.

3. The frequency debugging board according to claim 2, further comprising a communication interface disposed on the bottom plate and connected to the controller.

4. The frequency debugging board according to claim 3, further comprising a shielding layer disposed on the bottom plate, wherein
the variable capacitor, the at least one switch, the controller and the communication interface are located on a first surface of the bottom plate, the shielding layer is located on a second surface of the bottom plate, the plurality of first probes and the plurality of second probes penetrate through the bottom plate and the shielding layer, an end of a first probe and an end of a second probe are in contact with the first surface, and another end of the first probe and another end of the second probe protrude from the shielding layer; and the first surface and the second surface are opposite to each other, and are perpendicular to a thickness direction of the bottom plate.

5. A frequency debugging system, comprising:
an electronic device including an antenna to be tested and a capacitor to be tested;
a test coil configured to receive a signal sent by the antenna to be tested;
a frequency tester connected to the test coil and configured to detect a frequency of the signal in the test coil from the antenna to be tested, the frequency of the signal being an operating frequency of the electronic device;
a terminal connected to the frequency tester, the terminal being configured to receive the operating frequency of the electronic device sent by the frequency tester, and to determine whether a deviation of the operating frequency of the electronic device from a target frequency is within an allowable range; and
the frequency debugging board according to claim 1, wherein the frequency debugging board is connected to the terminal, and is arranged opposite to a side, where the antenna to be tested and the capacitor to be tested are located, of the electronic device; the frequency debugging board is configured to: receive an instruction sent by the terminal, and change at least one of a capacitance of the variable capacitor and a state of the at least one switch according to the instruction, so as to adjust the operating frequency of the electronic device to keep the deviation of the operating frequency of the electronic device from the target frequency within the allowable range.

6. The frequency debugging system according to claim 5, wherein the plurality of first probes are connected to the capacitor to be tested, and the plurality of second probes are connected to different portions of the antenna to be tested.

7. The frequency debugging system according to claim 6, wherein the electronic device includes a plurality of first contacts, two ends of the capacitor to be tested are each connected to a first contact, and the plurality of first probes are connected to the plurality of first contacts in one-to-one correspondence; and
the electronic device includes a plurality of second contacts, each turn of a coil of the antenna to be tested is connected to a second contact, and the plurality of second probes are connected to the plurality of second contacts in one-to-one correspondence.

8. The frequency debugging system according to claim 6, wherein a number of the plurality of second probes is same as a number of turns of a coil of the antenna to be tested, and a second probe is correspondingly connected to a turn of the coil of the antenna to be tested.

9. The frequency debugging system according to claim 5, wherein the frequency debugging board includes a communication interface and a controller that are disposed on the bottom plate, the controller is connected to the variable capacitor, the at least one switch, and the communication interface; the frequency debugging board is connected to the terminal through the communication interface, so as to receive the instruction from the terminal; the controller is configured to change the capacitance of the variable capacitor and the state of the at least one switch according to the instruction.

10. The frequency debugging system according to claim 5, wherein the frequency debugging board includes a shielding layer disposed on the bottom plate, and the shielding layer is located on a side of the frequency debugging board proximate to the electronic device.

11. The frequency debugging system according to claim 5, wherein the antenna to be tested is one of an antenna based on a near field communication technology and an antenna based on a radio frequency identification technology.

12. The frequency debugging system according to claim 5, wherein the electronic device further includes a display panel, and the display panel is one of an electronic paper display panel, a liquid crystal display panel, an organic electroluminescent display panel or a quantum dot light-emitting diode display panel.

13. The frequency debugging system according to claim 5, wherein the electronic device is one of an electronic price tag, a mobile phone, a tablet computer or a wearable device.

14. A method for debugging the electronic device in the frequency debugging system according to claim 5, the method comprising:
receiving, by the test coil, the signal sent by the antenna to be tested in the electronic device;
transmitting, by the test coil, the received signal to the frequency tester;

detecting, by the frequency tester, the frequency of the signal sent by the test coil;

transmitting, by the frequency tester, the detected operating frequency of the electronic device to the terminal, the frequency of the signal being the operating frequency of the electronic device;

determining, by the terminal, whether the deviation of the operating frequency of the electronic device from the target frequency is within the allowable range; and if the deviation of the operating frequency of the electronic device from the target frequency is not within the allowable range, sending, by the terminal, the instruction to the frequency debugging board, so that the frequency debugging boarder changes at least one of the capacitance of the variable capacitor and the state of the at least one switch in the frequency debugging board, so as to adjust the operating frequency of the electronic device to keep the deviation of the operating frequency of the electronic device from the target frequency within the allowable range.

15. The method for debugging the electronic device according to claim 14, wherein the frequency debugging board further includes a controller disposed on the bottom plate, and the controller is connected to the variable capacitor and the at least one switch;

if the deviation of the operating frequency of the electronic device from the target frequency is not within the allowable range, sending, by the terminal, the instruction to the frequency debugging board, so that the frequency debugging board changes at least one of the capacitance of the variable capacitor and the state of the at least one switch in the frequency debugging board, so as to adjust the operating frequency of the electronic device to keep the deviation of the operating frequency of the electronic device from the target frequency within the allowable range, includes:

if the deviation of the operating frequency of the electronic device from the target frequency is not within the allowable range, sending, by the terminal, the instruction to the controller, so that the controller changes at least one of the capacitance of the variable capacitor and the state of the at least one switch in the frequency debugging board, so as to adjust the operating frequency of the electronic device to keep the deviation of the operating frequency of the electronic device from the target frequency within the allowable range.

16. The method for debugging the electronic device according to claim 15, wherein the controller changing at least one of the capacitance of the variable capacitor and the state of the at least one switch in the frequency debugging board, so as to adjust the operating frequency of the electronic device to keep the deviation of the operating frequency of the electronic device from the target frequency within the allowable range, includes:

obtaining, by the terminal, an inductance of the antenna to be tested according to the operating frequency of the electronic device detected by the frequency tester, an initial capacitance of the capacitor to be tested, and an initial capacitance of the variable capacitor;

if the inductance is greater than or equal to an inductance threshold value, changing, by the controller, the state of each switch in the frequency debugging board, until the inductance is less than the inductance threshold value;

then, adjusting, by the controller, the capacitance of the variable capacitor to change the operating frequency of the electronic device accordingly, until the deviation of the operating frequency of the electronic device from the target frequency is within the allowable range; and if the inductance is less than the inductance threshold value, changing, by the controller, the capacitance of the variable capacitor in the frequency debugging board to change the operating frequency of the electronic device accordingly, until the deviation of the operating frequency of the electronic device from the target frequency is within the allowable range.

17. The method for debugging the electronic device according to claim 16, wherein the initial capacitance of the variable capacitor is 0.

18. The method for debugging the electronic device according to claim 17, further comprising:

when the inductance of the antenna to be tested is less than the inductance threshold value, recording, by the terminal, a state of each switch at this time;

when the deviation of the operating frequency of the electronic device from the target frequency is within the allowable range, recording, by the terminal, capacitance of the variable capacitor at this time as a target capacitance.

19. The method for debugging the electronic device according to claim 18, further comprising at least one of:

soldering a capacitor with the target capacitance to the electronic device; or, connecting second contacts of the antenna to be tested corresponding to each switch that is closed in the at least one switch.

20. A non-transitory computer-readable storage medium having stored therein computer program instructions that, when executed by a processor, cause the processor to perform the method for debugging the display device according to claim 14.

* * * * *